United States Patent [19]

Slayman et al.

[11] Patent Number: 4,973,544

[45] Date of Patent: Nov. 27, 1990

[54] METHOD FOR REVERSING TONE OR POLARITY OF PATTERN ON INTEGRATED CIRCUIT SUBSTRATE UTILIZING REVERSE CASTING BY PLANARIZATION

[75] Inventors: Charles W. Slayman, Newbury Park; Robert A. Metzger, Woodland Hills; Adele E. Schmitz, Newbury Park, all of Calif.

[73] Assignee: Hughes Aircraft Company, Los Angeles, Calif.

[21] Appl. No.: 320,208

[22] Filed: Mar. 7, 1989

[51] Int. Cl.$^5$ ............................................. G03C 5/00
[52] U.S. Cl. ................................... 430/323; 430/314; 430/317; 430/324; 430/329
[58] Field of Search ............... 430/312, 315, 317, 329, 430/314, 322, 323, 324

[56] References Cited

U.S. PATENT DOCUMENTS

| | | | |
|---|---|---|---|
| 4,076,860 | 2/1978 | Kuroda | 430/316 |
| 4,307,180 | 12/1981 | Pogge | 430/314 |
| 4,689,113 | 8/1987 | Balasubramanyam | 156/643 |

FOREIGN PATENT DOCUMENTS 45029   4/1981   Japan ................................. 430/312

Primary Examiner—Jose Dees
Attorney, Agent, or Firm—Paul M. Coble; W. K. Denson-Low

[57] ABSTRACT

The tone or polarity of a patterned layer such as a photoresist mask on an integrated circuit or device substrate is reversed with substantially perfect alignment. A liquid planarizing layer is formed and hardened onto the patterned layer and underlying substrate, filling in spaces between pattern areas. The planarizing layer is then etched to a sufficient depth to expose the patterned layer. Finally, the patterned layer is dissolved away, leaving the reversed tone image which is constituted by the planarizing material in the spaces which were filled in. Modified embodiments enable large spaces between original pattern areas to be effectively reversed, and multi-level reversed tone images to be formed in which the reversed tone layers are thicker than the original layers.

14 Claims, 5 Drawing Sheets

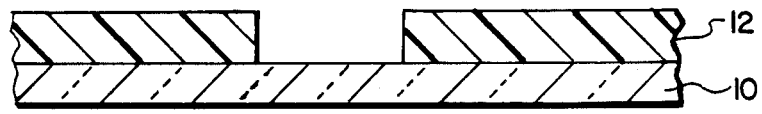
FIG.1.a. (PRIOR ART)
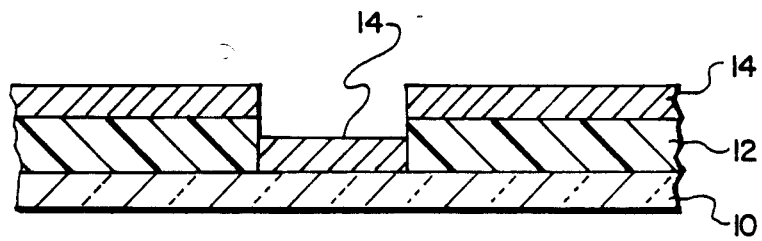
FIG.1.b. (PRIOR ART)
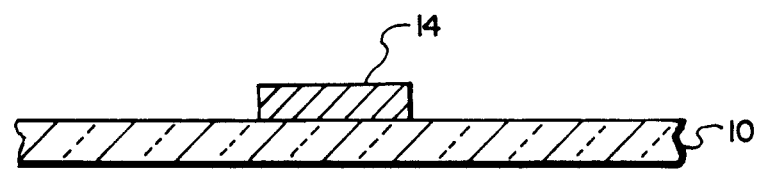
FIG.1.c. (PRIOR ART)

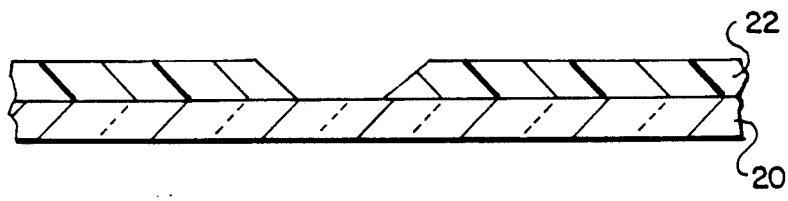
FIG.2.a.
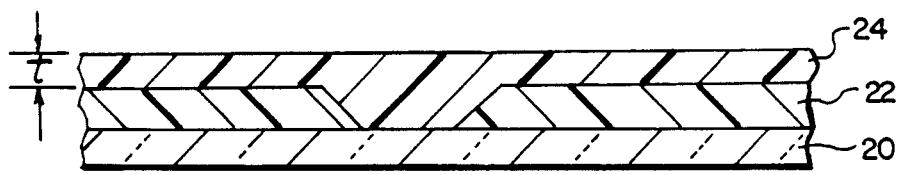
FIG.2.b.
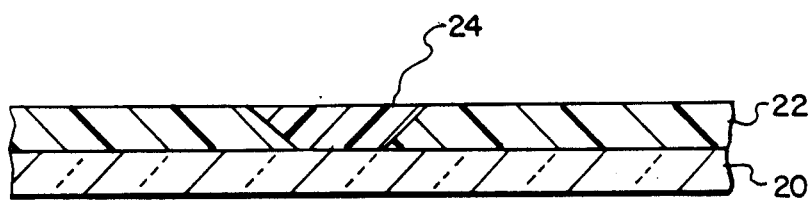
FIG.2.c.
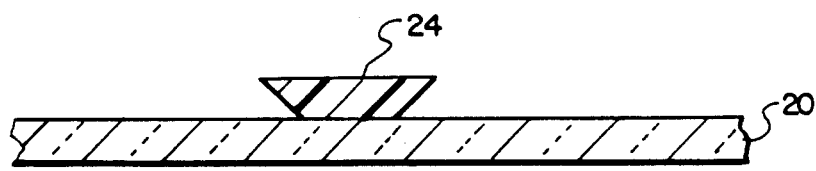
FIG.2.d.

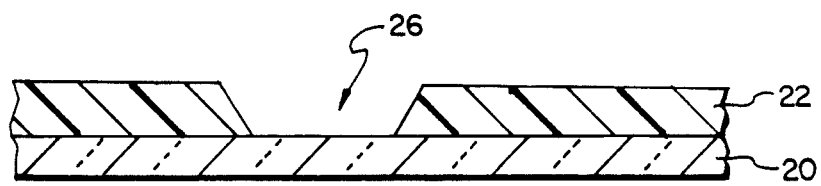
FIG.3.a.
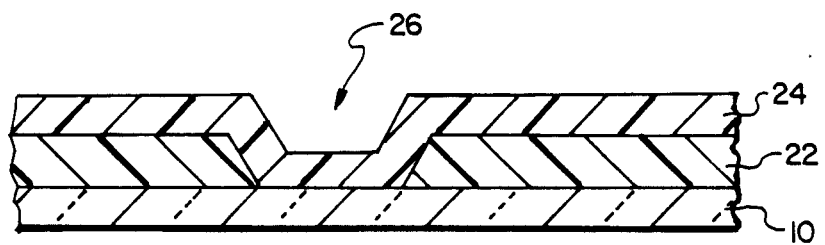
FIG.3.b.
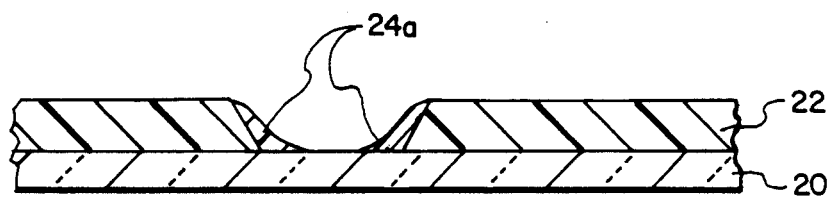
FIG.3.c.
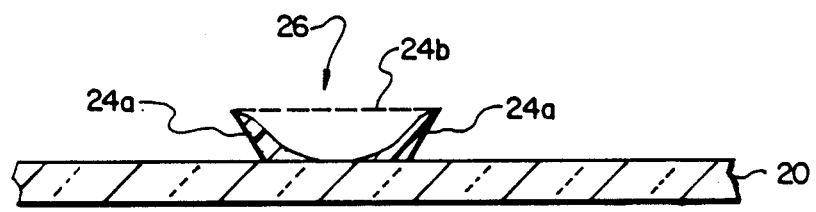
FIG.3.d.

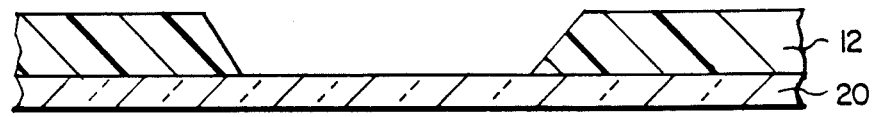
FIG.4.a.
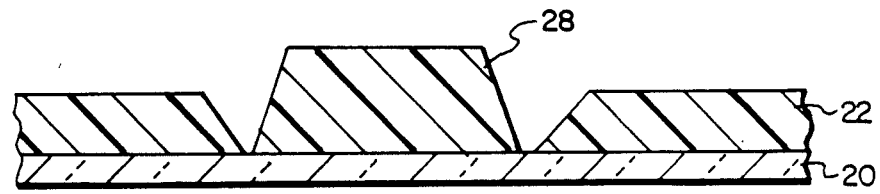
FIG.4.b.
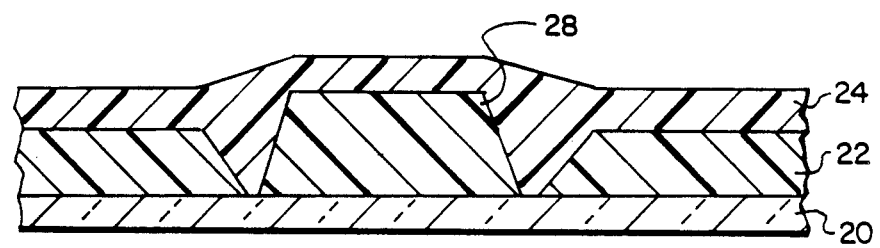
FIG.4.c.
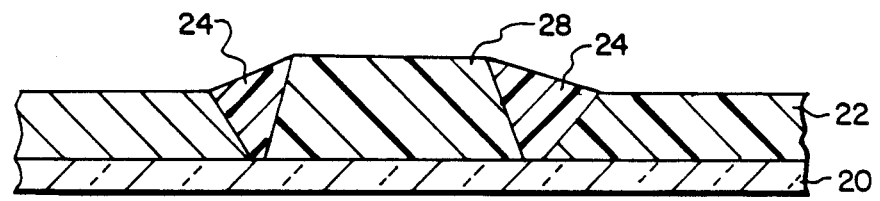
FIG.4.d.
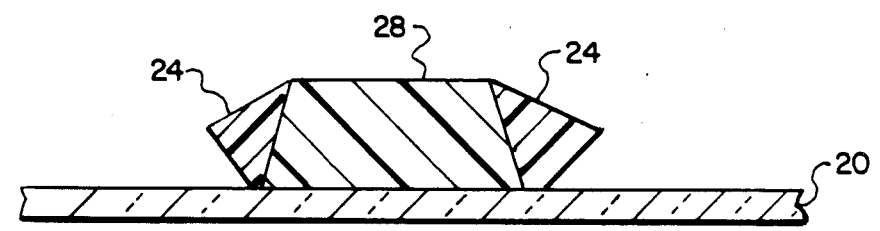
FIG.4.e.

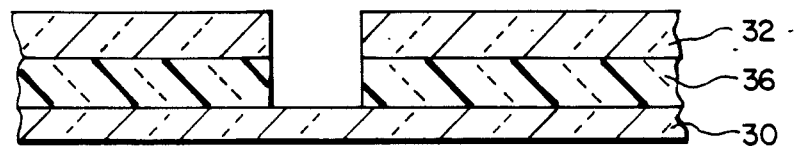
FIG.5.a.
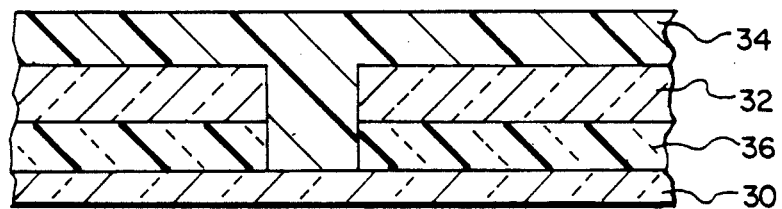
FIG.5.b.
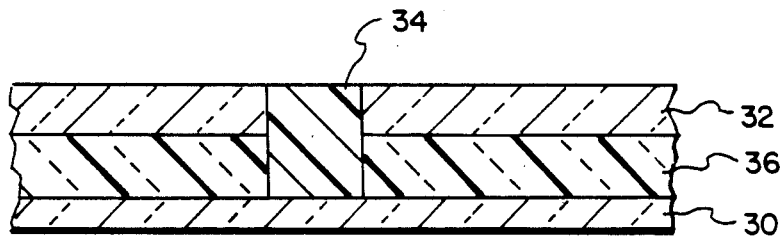
FIG.5.c.
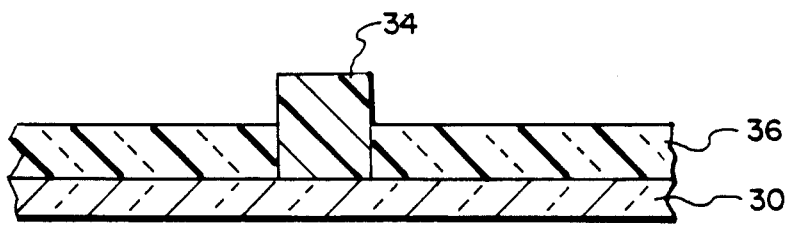
FIG.5.d

METHOD FOR REVERSING TONE OR POLARITY OF PATTERN ON INTEGRATED CIRCUIT SUBSTRATE UTILIZING REVERSE CASTING BY PLANARIZATION

BACKGROUND OF THE INVENTION

1. Field of the Invention

The present invention generally relates to the art of semiconductor fabrication, and more specifically to a novel and useful method for reversing the tone or polarity of a pattern on a semiconductor substrate which has been entitled "REVERSE CASTING BY PLANARIZATION" (RECAP).

2. Description of the Related Art

It is often desirable in the art of semiconductor fabrication to reverse the tone or polarity of a pattern on a substrate or other device layer for purposes including modification of the layer underlying the pattern. Such a technique is especially valuable in the production of self-aligned channel-stop and well implants in 0.5 micrometer bulk CMOS circuits. The Hughes Aircraft Company discloses a "quadruple-well" CMOS process in U.S. Pat. No. 4,633,289 which enables the design of high packing density and superior device performance, to which the application of the present invention provides an immediate and substantial advantage.

The level of integration attainable in integrated circuit fabrication is directly limited by the density to which individual devices (transistors, resistors, capacitors, etc.) may be packed on a chip. The packing density in turn is directly limited by a number of factors, two of which are relevant to the present invention: device isolation and pattern alignment.

In order to prevent short circuiting of adjacent device elements, it is necessary that the devices be electrically isolated from each other. Device isolation has been one of the most important problems associated with the fabrication of integrated circuits. With increasing packing density for very large scale integration (VLSI) applications, the problem of device isolation can fundamentally limit circuit design.

A variety of different methods have been employed in the development of the technology for device isolation. The local oxidation of silicon (LOCOS) process has been commonly used for the isolation of active devices in silicon metal oxide-semiconductor (MOS) integrated circuit. The process is described in the paper by E. Kooi, J. G. Van Lerop, and J. A. Appels, entitled "Formation of silicon nitride at a Si—SiO$_2$ interface during local oxidation of silicon and during heat treatment of oxidized silicon in NH$_3$ gas, " in J. Electochem. Soc. Vol. 123. pp. 1117-1120, 1976. However, applying the LOCOS process to VLSI circuits is severely limited by field oxide encroachment (the bird's beak phenomenon) and by lateral diffusion of channel stop dopants into the active device areas. Both effects overtake the active area near the channel edges; hence, the physical channel width becomes less than the desired channel width. The difference between physical and designed channel widths becomes significant when devices are scaled down for VLSI applications. This channel-narrowing effect increases the FET threshold voltage and reduces its current driving capability. In order to achieve the desired channel width, the corresponding mask dimension must be drawn oversized, which results in wasted layout area.

Various improved techniques have been proposed to reduce the bird's beak and lateral diffusion phenomenon, but generally achieve the desired device structures at the expense of added process complexity. Lift-off techniques, which are the reverse of photolithography with etching, have also been used for device isolation. The goal of using lift-off techniques is to achieve self alignment for higher packing density. "Self alignment" refers to the non-overlap of the channel and channel stop implants and/or other laterally adjacent pattern areas. It results in a sharp boundary between the two because there is only a single patterning exposure during the lift-off process. Lift-off isolation techniques provide greatly improved field isolation for MOSFETs (metal oxide-semiconductor field effect transistors).

A conventional thick-metal lift-off process, in which a metal film is evaporated onto a patterned resist layer and the resist layer subsequently dissolved to "lift-off" the metal film over the resist layer, thereby exposing the underlying substrate and forming a reverse image constituted by the remaining metal, depends on specially prepared materials, and there is also a concern about the reliability of the process as applied to VLSI fabrication. The resist tends to harden under reactive ion etching, making it more difficult to dissolve. Also, the naturally resulting geometry of the resist and overlying thick metal layer at the boundaries between the active areas and channel stops can impede a solvent from getting to the resist. For these reasons, lift-off of thick metal is often difficult to reproduce reliably. For reference purposes, a lift-off process for NMOS circuits using relatively thick (700 nm) aluminum has been reported by J. Y. Chen, R. C. Henderson, and D. E. Snyder in the paper "A novel self-alignment isolation process for VLSI" in IEEE Trans. Electron Devices, ED-30, No. 11, pp. 1521-1527, 1983.

As illustrated in FIG. 1a of the accompanying drawing, the generic prior art thick metal lift-off process utilizes a semiconductive wafer substrate 10 formed of silicon or other appropriate material. A sacrificial patterned layer 12 is applied to the substrate 10, the pattern corresponding to devices such as transistors, resistors, etc. to be integrated into the circuit. The patterned layer 12 typically comprises a known photoresist material such as AZ1350J, manufactured by the Hoechst Celanese Company of Somerville, N.J., and is patterned by photolithography.

The next step of the process is illustrated in FIG. 1b in which a relatively thick metal film 14 comprising, for example, 700 nm of aluminum or 400 nm of gold, is evaporated onto the surfaces of the substrate 10 and patterned layer 12. The final step of the process is illustrated in FIG. 1c in which the patterned layer 12 is dissolved away using a solvent such as acetone. Dissolution of the patterned layer 12 releases the metal film 14 which is formed thereon, causing the metal film 14 to be "lifted-off" the substrate 10. The resulting structure consists of the substrate 10 and metal film 14 on areas of the substrate 10 which were exposed directly to the metal film evaporation (not masked by the photoresist patterned layer 12).

Although the metal film lift-off method is inherently self-aligning, the resist pattern must be formed with extremely precise vertical or undercut wall profiles to be applicable to VLSI fabrication. The metal evaporation must be well collimated and normal to the wafer surface to prevent deposition on the resist sidewalls. The lift-off process is also prone to particulate contamination and formation of gaps between the resist and metal as discussed hereinabove.

The reverse-tone image is constituted by the areas of the metal film 14 which remain after performing the dissolution step illustrated in FIG. 1c. The reversal process enables implantation or other desired operation to be performed on the exposed (reversed) areas of the substrate 10.

An improvement to the thick metal lift-off process is disclosed in U.S. patent application Ser. No. 66,800, filed June 25, 1987 abandoned. The process is entitled "SELF-ALIGNED ISOLATION" (SAIL), and utilizes thin metal lift-off. In the process, a field oxide is grown first, followed by a channel stop implant that is self-aligned to the active area by means of a lift-off process that utilizes only thin metal. The self-alignment of channel stop implant to active area is shown to improve the breakdown voltage of MOSFET devices. Direct window isolation is used to reduce oxide encroachment and reduce out-diffusion of boron channel stop implant into the active area. As a result, the narrow width effect is minimal. Since thin metal liftoff can be performed reproducibly, the SAIL process is described as a high-yield process for VLSI fabrication.

Although the SAIL process constitutes a major improvement over conventional thick metal lift-off, good lift-off places stringent requirements on the resist wall profile. Gaps between the resist and metal inevitably occur, thereby limiting the isolation and alignment efficiency as well as the packing density achievable by the fabrication process.

SUMMARY OF THE INVENTION

The present invention provides a novel and useful process for reversing the tone or polarity of a pattern such as a photoresist mask on an integrated circuit substrate with substantially perfect alignment. In accordance with the process, a liquid planarizing layer is formed and hardened onto the patterned layer and underlying substrate, filling in the spaces between pattern areas. The planarizing layer is then etched to a sufficient depth to expose the patterned layer. Finally, the patterned layer is dissolved away, leaving the reversed tone image which is constituted by the planarizing material in the spaces which were filled in.

Modified embodiments enable large spaces between original pattern areas to be effectively reversed, and multi-level reversed tone images to be formed in which the reversed tone layers are thicker than the original layers.

In accordance with an important feature of the present invention, the planarizing layer is applied by means of a spinning process which in the present application is effectively a casting process. The centrifugal forces induced in the planarizing material during spinning enhance the casting effectiveness and cause the planarizing material to fill in all underlying spaces, including the pattern layer wall profiles. The result is a substantially perfect reverse cast image with alignment efficiency of 100%. The greatly improved alignment as compared to all prior art processes known heretofore provides further increases in isolation efficiency and packing density, and a generally dramatic advance in the art of semiconductor fabrication technology.

One goal of the present invention is to provide an improved process for reversing the tone or polarity of a pattern on a semiconductor substrate with substantially perfect alignment. Another is to provide a novel process which improves both the device isolation efficiency in semiconductor fabrication technology, and the packing density in semiconductor fabrication technology.

The present invention also seeks to provide a novel process for reversing the tone or polarity of a patterned layer on an underlying material which is applicable to any technology, such as lithography, to which the presently disclosed sequence of process steps may be applied.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 1a to 1c are sectional views illustrating a conventional prior art thick metal lift-off process;

FIGS. 2a to 2c are sectional views illustrating the generic process of the present invention;

FIGS. 3a to 3d are sectional views illustrating a problem resulting from application of the present generic process to large area planarization;

FIGS. 4a to 4e are sectional views illustrating a modified embodiment of the present process which overcomes the problem illustrated in FIGS. 3a to 3d; and FIGS. 5a to 5d are sectional views illustrating another modified embodiment of the present process applied to multi-level semiconductor fabrication.

DETAILED DESCRIPTION OF THE INVENTION

The generic REVERSE CASTING BY PLANARIZATION (RECAP) method embodying the present invention is illustrated in FIGS. 2a to 2d. The first step of the process, illustrated in FIG. 2a, is similar to the initial step in the prior art metal lift-off process in that a patterned layer 22 is formed on a silicon wafer substrate 20. The layer 22 is created by photolithography and may comprise AZ1350J photoresist.

It will be noted that the wall profile of the patterned layer 22 need not be vertical or undercut as required in the prior art metal lift-off method. The profile may even have a slight outward taper toward the adjacent exposed areas of the substrate 20 as shown in the drawings.

Although the present process finds immediate practical application in the field of semiconductor fabrication, it is not so limited. The substrate 20 may be formed of plastic or even paper, and the patterned layer formed of chemical resist or even ink. The present process may be used to reverse the optical tone or electrical polarity of any known layered material structure, and is limited only by the availability of materials capable of performing the process steps of the invention in the particular environment of the application.

The second step of the process is illustrated in FIG. 2b and comprises forming and hardening a planarizing layer 24 onto the exposed surfaces of the silicon substrate 20 and patterned photoresist layer 22. The planarizing layer 24 can be comprised of an electron beam sensitive polymer such as polymethyl methacrylate (PMMA), and is applied by a conventional spinning process. The planarizing layer 24 has a substantially flat upper surface and fills all exposed areas on the substrate 20 between lateral edges of the patterned layer 22, as well as forming a uniform thickness t on the upper surface of the patterned layer 22. In addition, the casting nature of the process enhanced by the centrifugal force imparted by spinning ensures that the vertical wall profile of the patterned layer 22 is filled in completely by the planarizing material. After application, the planarizing layer 24 is baked to harden it onto the underlaying layers 20 and 22.

The next step of the present process is illustrated in FIG. 2c, and consists of removing a sufficient thickness of the planarizing layer 24 to expose the patterned layer 22. This may preferably be performed by plasma etching using a Technics $O_2$ plasma etcher. The etching depth, or the thickness of the planarizing material which is removed, is substantially equal to the thickness t of the planarizing layer 24 on the patterned layer 22.

The final step of the process is illustrated in FIG. 2d and comprises removing the patterned layer 22 from the substrate 20. This may be accomplished for the described photoresist by a stripping process utilizing MF 312 developer, which is also a product of the Hoechst Celanese Company. MF 312 will attack the photoresist, but will not affect the PMMA patterns. The resulting structure consists of exposed areas of the substrate 20 which were initially masked by the photoresist patterned layer 22, and areas of the planarizing layer 24 corresponding to the original exposed areas of the substrate 20 which remain after the photoresist is dissolved by the developer in the step of FIG. 2d. The image which is produced by the present process is not only a reverse tone image of the original, but has substantially perfect alignment with the original image due to the reverse casting of the photoresist wall profile by the planarizing material. The process thereby enables greatly improved isolation and packing density in integrated circuit fabrication as discussed hereinabove.

As illustrated in FIGS. 3a to 3d, the generic process of the invention requires modification to produce the desired results where the exposed areas of the substrate 20 are relatively large. The problem encountered is that suitable planarizing materials, such as PMMA, are only capable of planarization over short distances (on the order of 1 to 10 microns). Assuming that the patterned layer 22 illustrated in FIG. 3a forms an exposed area 26 on the substrate 20 which is significantly larger than 10 microns, the applied planarizing material will not planarize perfectly to form a flat surface but will form a depression in the area 26. Etching of the planarizing layer 24 in the process step of FIG. 3c will produce the structure illustrated, in which the substrate 20 is exposed in the central portion of the area 26. Dissolution of the patterned layer 22 in the step of FIG. 3d will produce a reversed tone image constituted by areas 24a of the planarizing layer 24, which are formed at the edges of the patterned layer 22 at which the thickness of the planarizing layer 24 was thicker than t. The undesirable reversed image constituted by the areas 24a is illustrated as deviating from the desired flat surface designated by a broken line 24b.

A modification of the generic process which overcomes the problem illustrated in FIGS. 3a to 3d is presented in FIGS. 4a to 4e. The steps of FIGS. 4a, 4c, 4d, and 4e correspond to the generic steps of FIGS. 2a to 2d, respectively. In this example, a suitable choice for layer 22 would be polysilicon. However, the modified process included the additional step, illustrated in FIG. 4b, of forming an ancillary layer 28 on the exposed areas of the substrate.

The step of FIG. 4b consists of filling in the exposed areas on the substrate 20, while leaving gaps of roughly 1 to 10 $\mu$m between the filled-in areas and the adjacent edges of the patterned layer 22, by means of a reverse tone lithography or other suitable process. The ancillary layer 28 may be formed of a compatible material, such as AZ1350J, which will be dissolved in the final step of the process, or of a material which will remain after the dissolution step is performed.

The process step of FIG. 4c results in substantial planarization (negligible variation in the surface of the planarizing material) in the gaps between the layers 22 and 28, allowing the RECAP process to be extended over large distances. A suitable choice for layer 24 would be Kodak 809 photoresist or PMMA. Although the thickness of the ancillary layer 28 should not be less than that of the patterned layer 22, it may be somewhat greater as illustrated in FIGS. 4a to 4e.

A further modification of the present RECAP process is illustrated in FIGS. 5a to 5d. This modification enables the process to be extended to multi-level semiconductor fabrication, and further enables the reversed tone layer constituted by the planarizing material which remains after completion of the process to be thicker than that of an original or primary patterned layer. The modified process comprises providing a primary layer 36 between a substrate 30 and a sacrificial layer 32 in alignment with the patterned layer 32 in FIG. 5a. The primary layer 36 may be formed of a thermal oxide, whereas the sacrificial layer 32 may be formed of polysilicon.

In the present example, the planarizing layer 34 applied in the step of FIG. 5b may be formed of AZ1350J, which is etched using Technics $O_2$ plasma in the step of FIG. 5c. The sacrificial patterned layer 32 is stripped in the step of FIG. 5d using Branson/IPC PDE-100 plasma.

In addition to providing a multi-level reversed tone image as illustrated in FIG. 5d, this modified embodiment of the invention enables the reversed tone areas constituted by the remaining planarizing layer 34 to be thicker than the primary layer 36. More specifically, planarizing layer 34 is equal to the sum of the thicknesses of the primary layer 36 and sacrificial layer 32. This feature is especially useful where it is desired to form a second implant in an area not exposed to an original implant using a higher energy level.

EXAMPLE

The large area and multi-level embodiments of the present invention described with references to FIGS. 4a to 4e and 5a to 5d were reduced to practice in combination utilizing the following process steps.

1. Apply a 400 nm thermal oxide primary layer and a 400 nm polysilicon sacrificial patterned layer by photolithography.

2. Reactive ion etch the polysilicon and thermal oxide layers and strip the resist. Steps 1 and 2 produce the structure illustrated in FIG. 5a.

3. Form an ancillary layer as described with reference to FIG. 4b by coating the structure with AZ1350J photoresist, overexposing the reverse-tone version of the lithography mask used in step 1 and bake at 180° C.

4. Form a planarizing layer using Kodak 809 photoresist to produce the structure illustrated in FIG. 5b (with the underlying ancillary layer).

5. Etch the planarizing layer using Technics O$_2$ plasma to expose the patterned polysilicon layer. This corresponds to the step of FIG. 5c.

6. Strip the polysilicon using Branson/IPC PDE-100 plasma with a CF$_4$/O$_z$ gas.

The resulting structure, corresponding to FIG. 5d with the large spaces between the patterned layer areas filled in with ancillary AZ1350J material, comprised a multi-level reversed tone image as desired with high alignment accuracy in all areas of the pattern including the large image areas.

While several illustrative embodiments of the invention have been shown and described, numerous variations and alternate embodiments will occur to those skilled in the art without departing from the scope and spirit of the invention. Accordingly, it is intended that the present invention may be practiced within the scope of the appended claims otherwise than as specifically described.

We claim:

1. A method of reversing a tone of a patterned layer on a substrate, comprising the steps of:
    (a) forming an undersized ancillary layer on exposed areas of the substrate in such a manner that lateral gaps are provided between adjacent edges of the patterned layer and the ancillary layer;
    (b) forming a hardened planarizing layer on the patterned layer and exposed areas of the substrate;
    (c) removing a sufficient thickness of the planarizing layer and to expose the patterned layer;
    (d) selectively removing the patterned layer.

2. The method of claim 1, in which the ancillary layer is formed of a material which remains on the substrate after performing step (d).

3. The method of claim 1, in which the lateral gaps are sufficiently small that substantial planarization will occur therein during step (b).

4. The method of claim 1, in which step (a) comprises a photolithography process.

5. The method of claim 1, in which the ancillary layer comprises a photoresist material.

6. The method of claim 1, in which the planarizing layer comprises a photoresist material.

7. The method of claim 1, in which step (b) comprises a spinning process.

8. The method of claim 1, in which step (c) comprises an etching process.

9. The method of claim 8, in which the etching process comprises plasma etching.

10. The method of claim 1, in which step (d) comprises a stripping process.

11. The method of claim 1, in which the substrate comprises a silicon material.

12. The method of claim 1, in which the patterned layer comprises a photoresist material.

13. The method of claim 1, in which the planarizing layer comprises an electron beam sensitive polymer.

14. The method of claim 13, in which the electron beam sensitive polymer comprises polymethyl methacrylate.

* * * * *